United States Patent
Lander et al.

(10) Patent No.: US 7,157,337 B2
(45) Date of Patent: Jan. 2, 2007

(54) METHOD OF MANUFACTURING A SEMICONDUCTOR DEVICE AND SEMICONDUCTOR DEVICE OBTAINED BY MEANS OF SUCH A METHOD

(75) Inventors: Robert James Pascoe Lander, Leuven (BE); Dirk Maarten Knotter, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/544,412

(22) PCT Filed: Jan. 16, 2004

(86) PCT No.: PCT/IB2004/050030
§ 371 (c)(1),
(2), (4) Date: Aug. 3, 2005

(87) PCT Pub. No.: WO2004/070834
PCT Pub. Date: Aug. 19, 2004

(65) Prior Publication Data
US 2006/0138475 A1     Jun. 29, 2006

(30) Foreign Application Priority Data
Feb. 3, 2003     (EP) .................................. 03100213

(51) Int. Cl.
*H01L 21/8234* (2006.01)
*H01L 21/8238* (2006.01)
*H01L 21/20* (2006.01)
*H01L 21/4763* (2006.01)

(52) U.S. Cl. ...................... 438/275; 438/199; 438/301; 438/303; 438/591; 438/593; 438/584; 438/585; 438/587; 438/153; 438/154; 438/157; 438/216; 438/163; 438/669; 438/976; 257/E21.632

(58) Field of Classification Search ................ 438/275, 438/199, 584–585, 587, 301–303, 591–593, 438/153–154, 157, 163, 216, 669, 976
See application file for complete search history.

(56) References Cited

U.S. PATENT DOCUMENTS

| | | | |
|---|---|---|---|
| 5,786,252 A * | 7/1998 | Ludikhuize et al. | ........ 438/275 |
| 6,383,879 B1 | 5/2002 | Kizilyalli et al. | |
| 2002/0151125 A1 | 10/2002 | Woo-Sik et al. | |
| 2003/0080387 A1 | 5/2003 | Jae et al. | |
| 2003/0094659 A1* | 5/2003 | Mistry et al. | ................ 257/369 |

* cited by examiner

*Primary Examiner*—Michael Lebentritt
*Assistant Examiner*—Mohsen Ahmadi
(74) *Attorney, Agent, or Firm*—Peter Zawilski

(57) ABSTRACT

Consistent with an example embodiment according to the invention, a material for the intermediate layer is chosen which can be selectively etched with respect to the dielectric layer. Before the deposition of the first conductor layer, the intermediate layer is removed at the location of the first channel region, and after the deposition of the first conductor layer and the removal thereof outside the first channel region and before the deposition of the second conductor layer, the intermediate layer is removed at the location of the second channel region. Thus, field effect transistors (FETs) are obtained in a simple manner and without damage to their gate dielectric. Preferably, a further intermediate layer is deposited on the intermediate layer which can be selectively etched with respect thereto.

10 Claims, 5 Drawing Sheets

Figure 1:
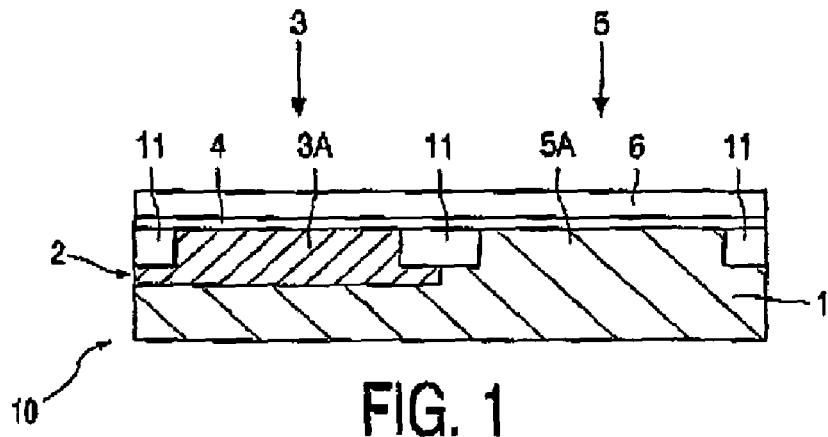
Figure 2:
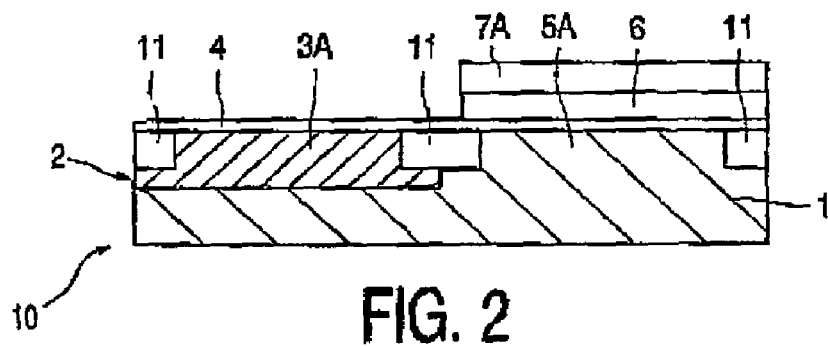
Figure 3:
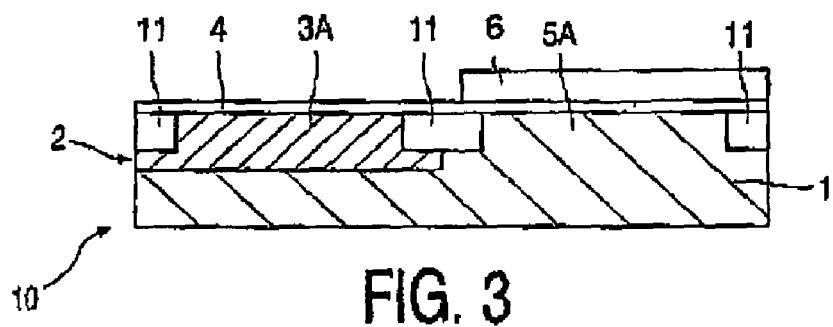
Figure 4:
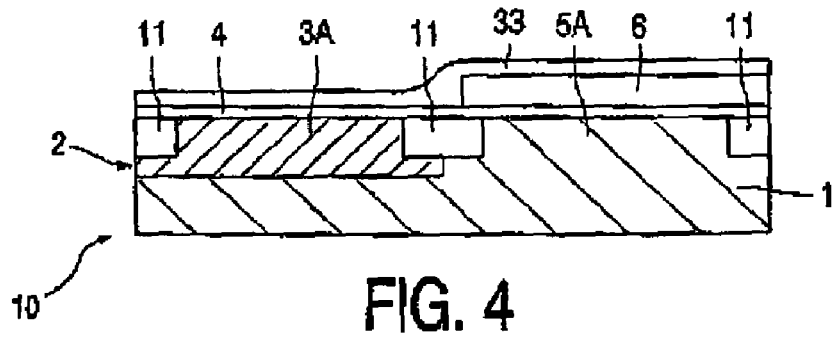
Figure 5:
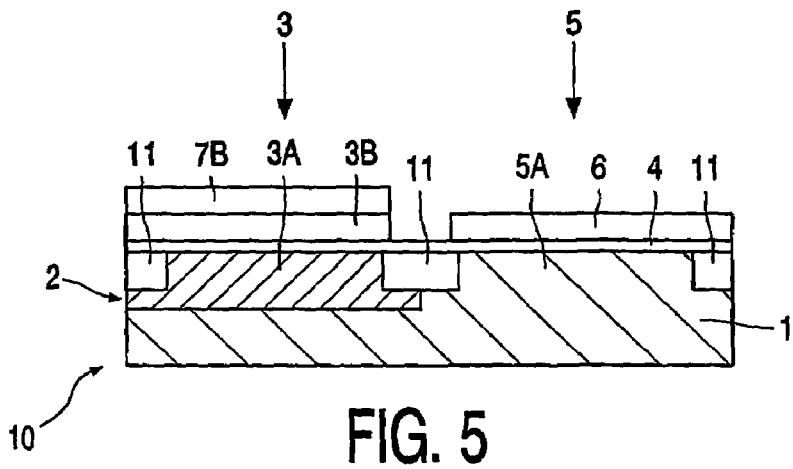
Figure 6:
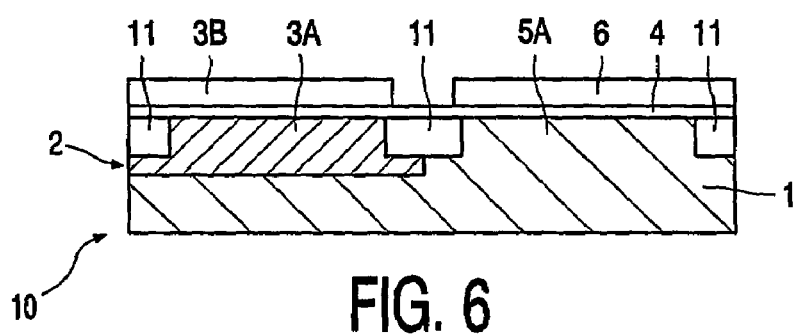
Figure 7:
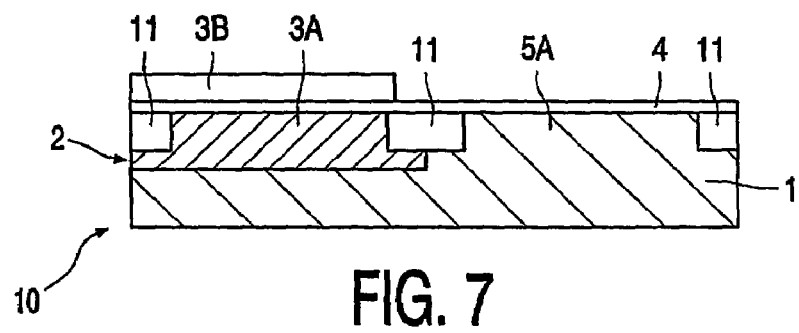
Figure 8:
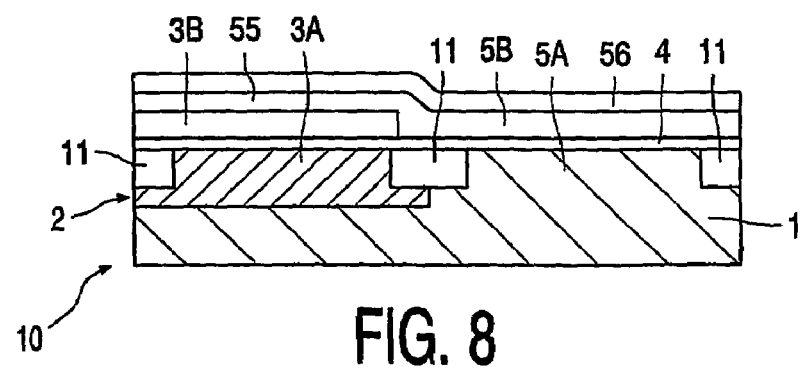
Figure 9:
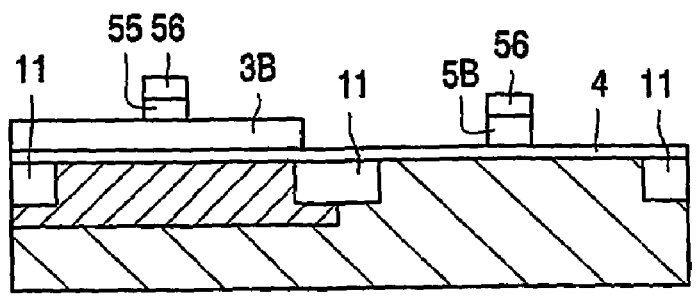

METHOD OF MANUFACTURING A SEMICONDUCTOR DEVICE AND SEMICONDUCTOR DEVICE OBTAINED BY MEANS OF SUCH A METHOD

The invention relates to a method of manufacturing a semiconductor device with a substrate and a semiconductor body comprising a first field effect transistor with a first source, drain and channel region of a first conductivity type and a first gate electrode which includes a first conductor and which is separated from the channel region by a dielectric layer, and comprising a second field effect transistor with a second source, drain and channel region of a second conductivity type, opposite to the first conductivity type, and a second gate electrode which includes a second conductor that is different from the first conductor, and which is separated from the channel region by a dielectric layer, wherein to form the gate electrodes a first conductor layer is applied to the semiconductor body provided with the dielectric layer, which conductor layer is subsequently removed again outside the first channel region, after which a second conductor layer is applied to the semiconductor body, and wherein, before the first conductor layer is applied, an intermediate layer is provided on the dielectric layer. Such a method, in which the first and the second gate electrode are made of a -metallic- conductor is very attractive for future (C)MOSFET (=Complementary Metal Oxide Semiconductor Field Effect Transistor) silicon devices, the series resistance being reduced, penetration of boron atoms into the gate oxide being counteracted, and the occurrence of depletion-layer effects in a gate electrode that would be composed of polycrystalline silicon being precluded. It is noted that the term gate oxide as used herein does not only refer to an oxide or oxynitride of silicon but also to a material such as silicon nitride.

A method of the type mentioned in the opening paragraph is known from United States patent specification U.S. Pat. No. 6,383,879, published on 7 May 2002. In said document it is shown how two MOS transistors are made in, respectively, an n-type channel region (N-MOS transistor) and a p-type channel region (P-MOS transistor), with a so-termed N-metal and a so-termed P-metal being applied to a dielectric layer covering both regions. In this case, an N-metal and a P-metal are to be taken to mean a metal or metallic material whose work function is close to the Fermi level of, respectively, N-type doped and P-type doped polycrystalline silicon, the Fermi levels in question being approximately 4.15 and 5.2 eV, respectively. In the known method, a semiconductor body, wherein two transistors are formed in, respectively, an n-type region and a p-type region in a silicon semiconductor body, is provided with a dielectric layer on which two gate electrodes of a different metal are formed as follows: first, an intermediate layer of a material such as tantalum pentoxide, silicon nitride or aluminum oxide is provided. Next, at the location of the transistor to be formed first, a first conductor layer is provided and subsequently removed again outside the region of the first gate electrode. In this case, the intermediate layer serves as an etch-stop layer. Subsequently, a second conductor layer is deposited over the semiconductor body. By means of etching, said second conductor layer is removed again outside the first gate electrode already formed and outside the second gate electrode to be formed. In this case too, the intermediate layer serves as an etch-stop layer.

A drawback of the known method resides in that the transistors formed by means of said method have a relatively thick gate dielectric. After all, this is formed by two layers, i.e. the dielectric layer and the intermediate layer. Also the properties of such a gate dielectric composed of two different materials are less well defined.

Therefore, it is an object of the present invention to provide a method that enables both an N-MOS transistor and a P-MOS transistor to be readily made, and which, in addition, does not have the above-mentioned drawback.

To achieve this, a method of the type mentioned in the opening paragraph is characterized in accordance with the invention in that for the material of the intermediate layer use is made of a material that is selectively etchable with respect to the dielectric layer, and before the first conductor layer is provided, the intermediate layer is removed at the location of the first channel region, and after the first conductor layer has been provided and removed again outside the first channel region, and before the second conductor layer is provided, the intermediate layer is removed at the location of the second channel region. The invention is based on the recognition that in this manner the number of process steps to which the dielectric layer is exposed is minimized by virtue of the presence of the intermediate layer. The invention is further based on the recognition that a suitable choice of the material for the intermediate layer enables said layer to be selectively removed again, using comparatively mild etching techniques, at locations where it is not required. Said selective removal taking place, in particular, without removing also an undefined part of the dielectric layer, as occurs inevitably if a metallic conductor is provided on the dielectric layer and removed again by etching. This also depends on which metal is used. In a method in accordance with the invention, before the first conductor layer is provided, the intermediate layer is removed at the location of the first gate electrode to be formed, and before providing the second conductor layer, the intermediate layer is removed at the location of the second gate electrode. In the process of removing the superfluous parts of the first conductor layer, the intermediate layer can still serve as an etch-stop layer and protect the dielectric layer outside the first transistor. In the process of removing superfluous parts of the second conductor layer, the gate electrodes of both transistors are present already and protecting the dielectric layer is much less necessary because the parts of the dielectric layer forming the gate dielectric are and remain covered by, respectively, the first and the second conductor layer. An important advantage of the method in accordance with the invention finally is that the intermediate layer no longer forms part of the gate dielectrics of the finished transistors. As a result, said dielectrics may be very thin and composed of a single material.

In a first embodiment of a method in accordance with the invention, the intermediate layer is locally removed by means of photolithography and etching. This method is comparatively simple and fits in well with the customary technology.

In a further, also attractive, modification, prior to applying the first conductor layer, the intermediate layer is provided with a further intermediate layer the material of which is selectively etchable with respect to the material of the intermediate layer. This further intermediate layer is patterned by means of photolithography and etching. When the intermediate layer is being etched, the patterned part of the further intermediate layer can then be used as a mask. As a result, there is greater freedom as regards the choice of the etchants for the conductor layer because the intermediate layer is protected by the further intermediate layer instead of by a photoresist. An additional advantage in this connection is that also during the necessary removal of the photoresist, the intermediate layer is protected against the agents necessary for this operation.

A suitable material for the further intermediate layer is, for example, a metal such as aluminum. This is selectively etchable with respect to many materials and, in addition, many materials can be selectively removed with respect to this metal. Moreover, aluminum is a material that is frequently used as a connection conductor in the semiconductor technology. Thus, if aluminum is used, the method in accordance with this modification shows excellent compatibility with the customary silicon technology.

The most suitable choice as regards the material for the intermediate layer depends on which material is chosen for the dielectric layer. If $SiO_2$ is chosen as the later material, then an intermediate layer of Si is a very suitable choice. This material can be readily selectively removed with respect to $SiO_2$ and also effectively protects $SiO_2$. This is partly due to the fact that the element Si is common to both. If the dielectric layer comprises $SiO_2$ formed by thermal oxidation, then an intermediate layer of sputtered $SiO_2$ is an attractive variant. Readily, this material can also be selectively removed with respect to thermal $SiO_2$ (ratio of the etching rates in a hydrogen fluoride solution is approximately 20:1). As both materials comprise the same elements, the risk of contamination of the dielectric layer by the intermediate layer is minimal.

Also if $Si_xO_yN_z$ is chosen as the material for the dielectric layer, there are various suitable options for the material of the intermediate layer. If the oxygen content of the dielectric layer is chosen to be comparatively high, then $Si_3N_4$ or Si may be chosen as the material for the intermediate layer. If Si is chosen as the material for the intermediate layer, the risk of contamination of the dielectric layer is smallest and, in addition, selective removal of the intermediate layer is easiest If the oxygen content of the $Si_xO_yN_z$ of the dielectric layer is chosen to be comparatively low, then $SiO_2$ may advantageously be chosen as the material for the intermediate layer. In this case, the intermediate layer can be readily selectively removed.

If the first conductivity type is chosen to be the n-conductivity type, preferably, for the first conductor a material is chosen from the group composed of tantalum, tungsten, titanium or a nitride of these materials, and for the second conductor preferably a metal silicide is chosen. Preferably the redundant parts of the first conductor layer as well as the redundant parts of the second conductor layer are removed by means of etching. Particularly a method in accordance with the invention enables the etching technique that is very customary in the field of silicon technology to be applied without inconvenience. The invention finally also comprises a semiconductor device obtained by means of a method in accordance with the invention.

These and other aspects of the invention will be apparent from and elucidated with reference to the embodiment(s) described hereinafter.

In the drawings:

FIGS. 1 through 10 are diagrammatic, cross-sectional views at right angles to the thickness direction, of a semiconductor device in successive stages of the manufacture by means of a first embodiment of a method in accordance with the invention, and FIGS. 11 through 19 are diagrammatic, cross-sectional views at right angles to the thickness direction, of a semiconductor device in successive stages of the manufacture by means of a second embodiment of a method in accordance with the invention.

The Figures are not drawn to scale and some dimensions, such as dimensions in the thickness direction, are exaggerated for clarity. Corresponding areas or parts in the different Figures bear the same reference numerals whenever possible.

FIGS. 1 through 10 are diagrammatic, cross-sectional views at right angles to the thickness direction, of a semiconductor device in successive stages of the manufacture by means of an embodiment of a method in accordance with the invention. As a basis for the manufacture of the device 10, use is made (see FIG. 1) of a semiconductor body 2 with a substrate 1, here of silicon, in which a first MOSFET 3 will be formed at the location of an n-type semiconductor region 3A provided in the, in this case, p-type substrate 1, which semiconductor region forms the channel region 3A of the first transistor 3. The adjacent part of the substrate 1 serves as a channel region SA of a second MOSFET 5 to be formed. The channel regions 3, 5 are, in this case, electrically separated by means of insulating regions 11 of silicon dioxide, i.e. a so-termed trench insulation. The surface of the semiconductor body 2 is covered with a 0.5 to 1.5 nm thick dielectric layer 4 which contains, in this case, silicon dioxide. On said dielectric layer there is provided an intermediate layer 6, in this case, of silicon having a thickness in the range of 10 to 100 nm.

Subsequently (see FIG. 2), a photoresist 7A on the intermediate layer 6 is patterned. Next (see FIG. 3), the intermediate layer 6 is removed, at the location of the first transistor 3 to be formed, by means of etching using a silicon etch such as a mixture of hydrogen fluoride and nitric acid or a solution of potassium hydroxide. Subsequently, the photoresist 7A is removed by means of a so-termed photoresist stripper. For this purpose, use can be made of a plasma etching process.

Next (see FIG. 4), a first conductor layer 33 is provided by means of CVD (=Chemical Vapor Deposition) or PVD (=Physical Vapor Deposition) such as sputtering. In this case, titanium is chosen as the material for the first conductor layer 33, and the thickness is chosen to be preferably at least 5 nm, in this case 10 nm. Subsequently (see FIG. 5), a photoresist layer 7B is patterned. Next, the redundant parts of the first conductor layer 33 are removed by means of etching using a buffered hydrogen peroxide solution or a mixture of hydrogen peroxide and ammonia. In this process, the intermediate layer 6 serves as an etch-stop layer. The remaining part of the first conductor layer 33 serves as a gate electrode 3B of the first transistor 3 to be formed.

Next (see FIG. 6), the photoresist 7B is removed in the same manner as described above with respect to the photoresist 7A. Subsequently (see FIG. 7), the intermediate layer 6 is removed, in the same manner as described above, at the location of the second resistor 5 to be formed,.

Figure 10:
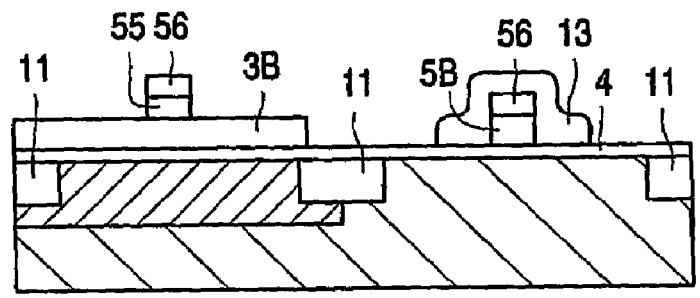
Figure 11:
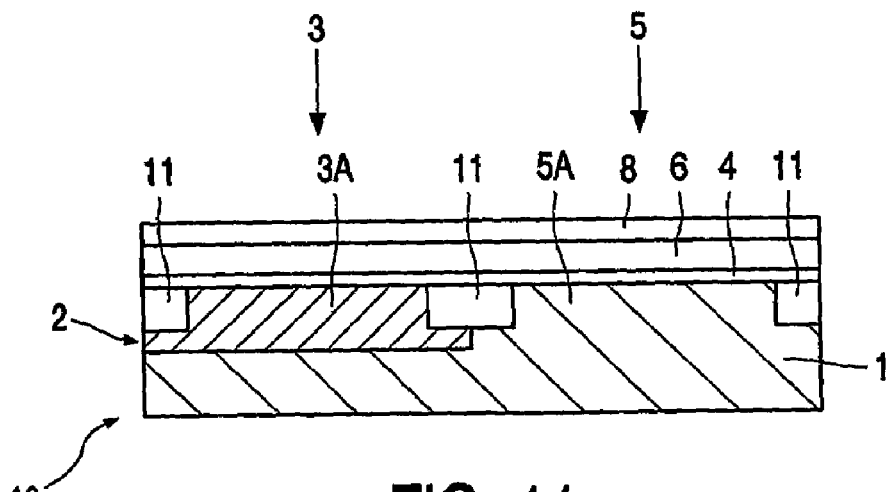
Figure 12:
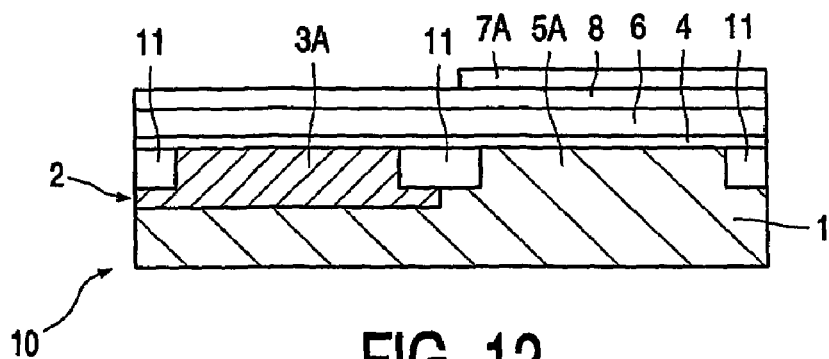
Figure 13:
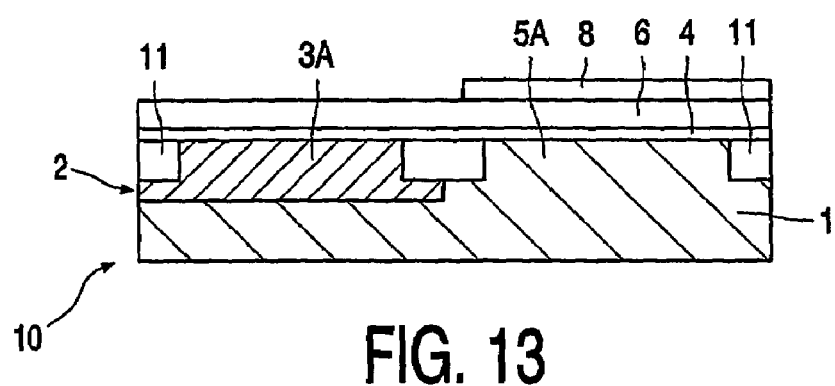
Figure 14:
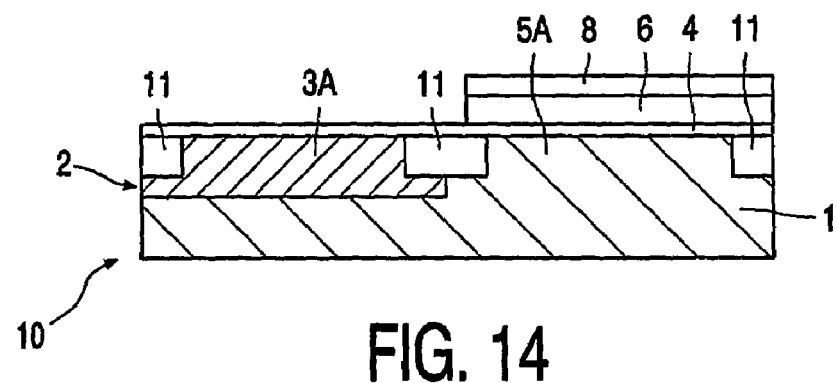
Figure 15:
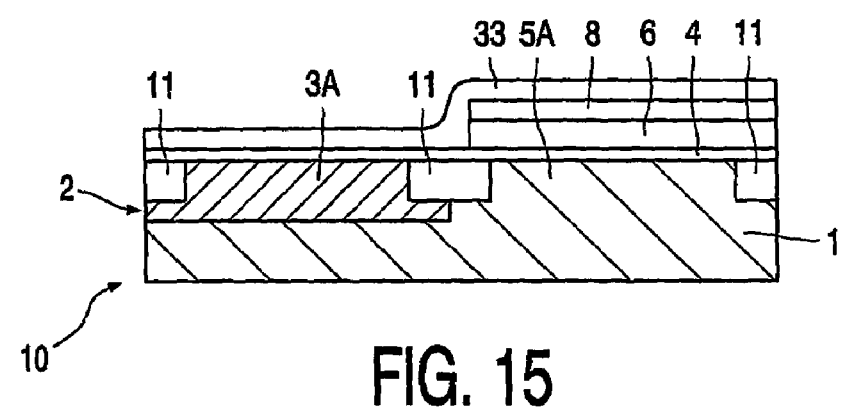
Figure 16:
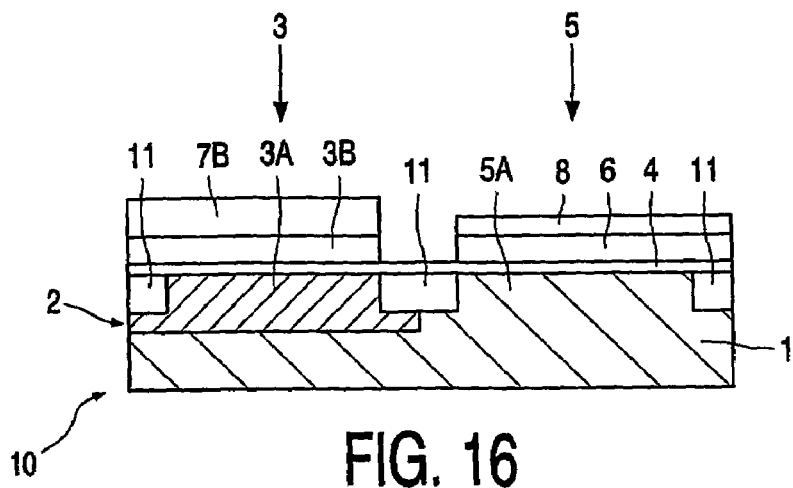
Figure 17:
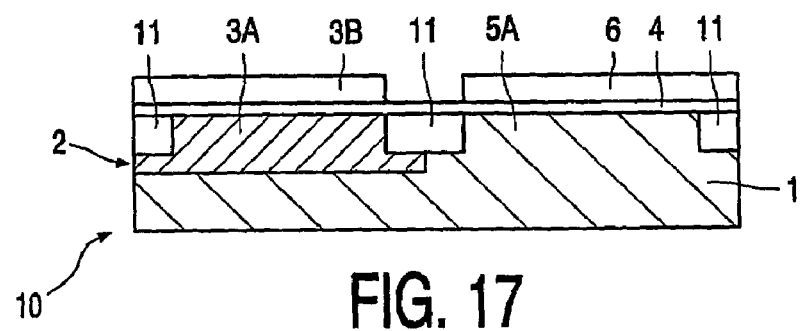
Figure 18:
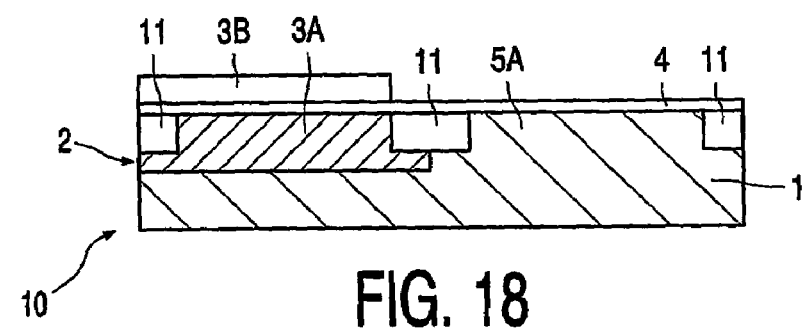
Figure 19:
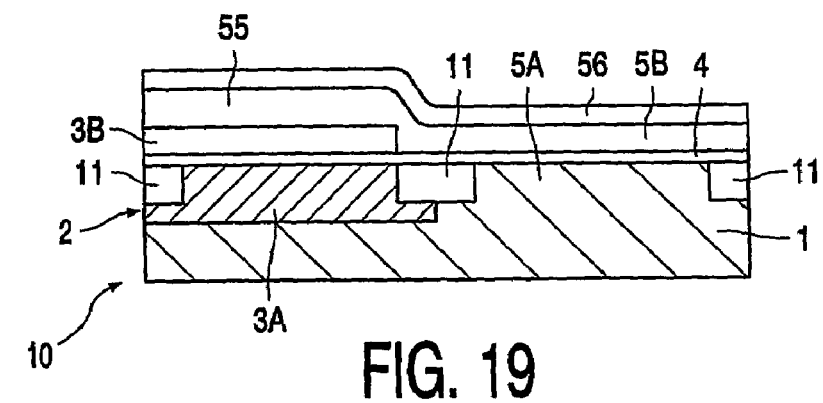

Subsequently (see FIG. 8), a second conductor layer 55, in this case of molybdenum disilicide, is provided in a thickness of, preferably, at least 5 mn, here 10 mn. In this example a further conductor layer 56, preferably, like in this case, of polycrystalline silicon is subsequently provided in a thickness of 100 mn, which will serve as an etch mask for removing the redundant parts of the second conductor layer 55, and as an anti-reflection layer for photolithography and, of course, as a conductor. The layer 56 is patterned as desired by means of photolithography and etching, in this case by means of plasma etching. In this manner (see FIG. 9), the second gate electrode 5B and, at the same time, a stack of a part of the layers 55, 56 situated above the first gate electrode 3B are formed. Finally (see FIG. 10), the parts of the gate electrode 3B that are situated outside the stack are removed by means of etching. In this process, as shown in FIG. 10, the gate electrode 5B of the second transistor 5 may be protected by a layer 13 of silicon dioxide or silicon nitride. It is to be noted that, in addition, the layer 56 of polycrystalline silicon may be advantageously provided with, for example, a 30 nm thick layer of $Si_xO_yN_z$ (not shown in the drawing).

The manufacturing process is subsequently continued in a manner that is customary in the CMOS technology. In this continuation of the process, in particular the source and drain regions, not shown, of the two transistors 3, 5 are formed by means of suitable implantations. Also, the semiconductor body 2 is covered with further insulating layers and provided with connection regions and, if necessary, connection conductors. Individual devices 10 are obtained by means of a separating technique such as sawing.

FIGS. 11 through 19 are diagrammatic, cross-sectional views at right angles to the thickness direction, of a semiconductor device in successive stages of the manufacture by means of a second embodiment of a method in accordance with the invention. The manufacture of this example corresponds substantially to that of the first example, and for the details reference is thus made to said part of the description. Here, only the most important differences will be briefly discussed. Immediately after the provision of the intermediate layer 6 (see FIG. 11), a further intermediate layer 8 is provided, in this case an aluminum layer having a thickness of 100 nm. By means of a photoresist 7A and etching, first (see FIG. 12) the further intermediate layer 8 is patterned (see FIG. 13) and the mask thus formed (see FIG. 14) is used to remove the intermediate layer 6 at the location of the first transistor 3. After the provision of the first conductor layer 33 (see FIG. 15), a photoresist 7B (see FIG. 16) is provided and the parts of the layer 33 situated outside said photoresist are removed. After the photoresist 7B (see FIG. 17) has been removed, the further intermediate layer 8 is removed entirely. Next (see FIG. 18), the intermediate layer 6 is removed completely. Finally (see FIG. 19), the second conductor layer 55 and the mask layer 56 are provided. From this point, the manufacturing process continues, for example, as described with respect to the first example.

The invention is not limited to the exemplary embodiment described herein, and within the scope of the invention many variations and modifications are possible to those skilled in the art. For example, devices having a different geometry and/or different dimensions may be manufactured. Instead of a substrate of Si, it is possible to alternatively use a substrate of glass, ceramic or a synthetic resin. The semiconductor body may then be formed by the so-termed SOI (=Silicon On Insulator). In this case, a so-termed substrate-transfer technique may or may not be used.

It is to be noted further that materials other than those mentioned in the examples may be used within the scope of the invention. It is also possible to use different deposition techniques for the above-mentioned, or other, materials, such as epitaxy, CVD (=Chemical Vapor Deposition), sputtering and evaporation coating. Instead of wet-chemical etching methods, use may alternatively be made of "dry" techniques such as plasma etching, and conversely.

It is also noted that the dielectric layer does not necessarily have to be the same or of the same thickness for both transistors.

It is also noted that the device may comprise further active and passive semiconductor elements or electronic components, such as a larger number of diodes and/or transistors and resistors and/or capacitors, whether or not in the form of an integrated circuit. The manufacture is of course effectively adapted thereto.

The invention claimed is:

1. A method of manufacturing a semiconductor device with a substrate and a semiconductor body the semiconductor device including a first field effect transistor with a first source, drain and channel region of a first conductivity type and a first gate electrode including a first conductor the first conductor is separated from the channel region by a dielectric layer, and the semiconductor device further including a second field effect transistor with a second source, drain and channel region of a second conductivity type, opposite to the first conductivity type, and a second gate electrode includes a second conductor that is different from the first conductor, and the second conductor is separated from the channel region by a dielectric layer, the method comprising:
   wherein to form the gate electrodes a first conductor layer is applied to the semiconductor body provided with the dielectric layer,
   which first conductor layer is subsequently removed outside the first channel region,
   after the first conductor layer is removed, a second conductor layer is applied to the semiconductor body, and wherein, before the first conductor layer is applied, an intermediate layer is provided on the dielectric layer, the intermediate layer is provided with a further intermediate layer, the material of the further intermediate layer being selectively etchable with respect to the material of the intermediate layer,
   wherein the intermediate layer is made of a material that is selectively etchable with respect to the dielectric layer,
   and before the first conductor layer is provided, the intermediate layer is removed at the location of the first channel region,
   and after the first conductor layer has been provided and removed outside the first channel region, and before the second conductor layer is provided,
   the intermediate layer is removed at the location of the second channel region, and
   wherein the intermediate layer is locally removed by etching in areas defined by a photoresist mask.

2. The method as recited in claim 1, wherein for the material of the further intermediate layer a metal is chosen with respect to the material of the further intermediate layer, the first conductor is selectively etchable.

3. The method as recited in claim 2, wherein aluminum is chosen as the material for the further intermediate layer.

4. The method as recited in claim 1, wherein $SiO_2$ is chosen as the material for the dielectric layer, characterized in that Si is chosen as the material for the intermediate layer.

5. The method as recited in claim 1, wherein thermal $SiO_2$ is chosen as the material for the dielectric layer, characterized in that sputtered $SiO_2$ is chosen as the material for the intermediate layer.

6. The method as recited in claim 1, wherein $Si_xO_yN_z$ having a comparatively high oxygen content is chosen as the material for the dielectric layer, characterized in that $Si_3N_4$ or Si is chosen as the material for the intermediate layer.

7. The method as recited in claim 1, wherein $Si_xO_yN_z$ having a comparatively low oxygen content is chosen as the material for the dielectric layer, characterized in that $SiO_2$ is chosen as the material for the intermediate layer.

8. The method as recited in claim 1, characterized in that the first conductivity type is chosen to be the n-type, and for the first conductor layer a material is chosen from the group composed of tantalum, tungsten, titanium or a nitride of these materials, and for the second conductor layer a metal silicide is chosen.

9. The method as recited in claim 1, characterized in that the superfluous parts of the first conductor layer (33) as well as the superfluous parts of the second conductor layer (55) are removed by means of etching.

10. A semiconductor device obtained the method as recited in claim 1.

* * * * *